United States Patent [19]

Sekiya

[11] Patent Number: 5,406,606
[45] Date of Patent: Apr. 11, 1995

[54] COUNTER

[75] Inventor: Makoto Sekiya, Toyokawa, Japan

[73] Assignee: Minolta Co., Ltd., Osaka, Japan

[21] Appl. No.: 300,035

[22] Filed: Sep. 2, 1994

[30] Foreign Application Priority Data

Sep. 8, 1993 [JP] Japan ............................ 5-223152

[51] Int. Cl.⁶ ........................................ H03K 21/40
[52] U.S. Cl. ........................................ 377/28; 377/8; 377/26
[58] Field of Search .............................. 377/8, 26, 28

[56] References Cited

U.S. PATENT DOCUMENTS 4,961,088 10/1990 Gilliland et al. ................. 355/206
5,090,033 2/1992 Murray-Shelley ................. 377/28

FOREIGN PATENT DOCUMENTS 0021253 2/1979 Japan ............................ 377/28
0046191 3/1982 Japan ............................ 377/28
0010821 1/1988 Japan ............................ 377/28

Primary Examiner—Margaret Rose Wambach
Attorney, Agent, or Firm—Burns, Doane, Swecker & Mathis

[57] ABSTRACT

A counter has a memory which stores at least three continuous numerical values and a controller which rewrites a lowest numerical value to a numerical value obtained by adding 1 to a largest numerical value within said continuous numerical values stored in the memory and discriminates whether or not said numerical values stored in the memory are continuous to judge a count error. When said numerical values stored in the memory are not continuous, the noncontinuous numerical value is corrected by adding 1 to the largest value of other continuous numerical values stored in said memory.

11 Claims, 6 Drawing Sheets

COUNTER

BACKGROUND OF THE INVENTION

1. Field of the Invention

The present invention relates to a counter.

2. Description of the Related Art

Conventional laser printers are known to have a photosensitive member, developing devices, cleaner and the like provided as units which are removable from the printer body. The aforesaid photosensitive members and the like deteriorate in accordance with an increase in the number of printed sheets. Therefore, a counter is provided to count the number of printed sheets. When the count value of said counter attains a predetermined value, the laser printer executes a warning indicating it is time to replace the unit (hereinafter referred to as "EP unit"). In general, the aforesaid counters are provided with a nonvolatile memory (e.g., $E^2PROM$) within the EP unit. Incrementation of the counter is accomplished when the CPU accesses the aforesaid nonvolatile memory and rewrites the count value in accordance with a count signal output from the main unit of the printer with every print.

However, about 10 $\mu$ seconds are required from the start of the aforesaid value rewriting to its completion when the CPU accesses the aforesaid nonvolatile memory on the EP unit side in accordance with a count signal output from the main unit of the printer. When, for whatever reason, the power source is suddenly cut off while the CPU is accessing the nonvolatile memory of the EP unit (the time between the start of writing to its completion), the present value to be counted is not incremented in the counter, such that an entirely different count value is erroneously written to memory.

In image forming apparatus such as laser printers, copying machines and the like, counters are constructed such that when continuously forming the same identical image on a plurality of sheets, the desired number of sheets for image formation is input from an input means such as a ten-key pad or the like. A countdown is executed from the aforesaid input desired number of sheets each time an image is formed on a sheet, such that when the count value reaches zero [0], the completion of image formations relative to the desired number of sheets is detected and the image forming apparatus is stopped.

In the aforesaid apparatus, when paper jams occur while continuously accomplishing image formations on a plurality of sheets, electrical noise is generated within the circuits including the aforesaid counter, which is disadvantageous inasmuch as counting errors may result.

SUMMARY OF THE INVENTION

A main object of the present invention is to provide a counter having an error detection function.

A further object of the present invention is to provide a counter which detects count values that result from counting errors, and corrects said count value to an accurate count value.

A still further object of the present invention is to provide a counter which corrects to an accurate count value an erroneous count value incurred by erroneous operation caused by a sudden power source stoppage such as a service interruption or the like.

An even further object of the present invention is to provide a counter which corrects to an accurate count value an erroneous count value incurred by erroneous operation caused by electrical noise generated within electrical circuits by a paper jam.

These objects of the present invention are achieved by providing a counter comprising:

a memory for storing continuous numerical values;

rewriting means for rewriting a lowest numerical value to a numerical value obtained by adding 1 to a largest numerical value within the said continuous numerical values stored in memory;

discrimination means for discriminating whether or not numerical values stored in memory are continuous;

decision means for deciding a count error has been generated when said discrimination means determines that numerical values stored in memory are not continuous.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DETAILED DESCRIPTION OF THE PREFERRED EMBODIMENTS

A first embodiment of the present invention is described hereinafter with reference to the accompanying drawings.

(1) Laser Printer construction

Figure 1:
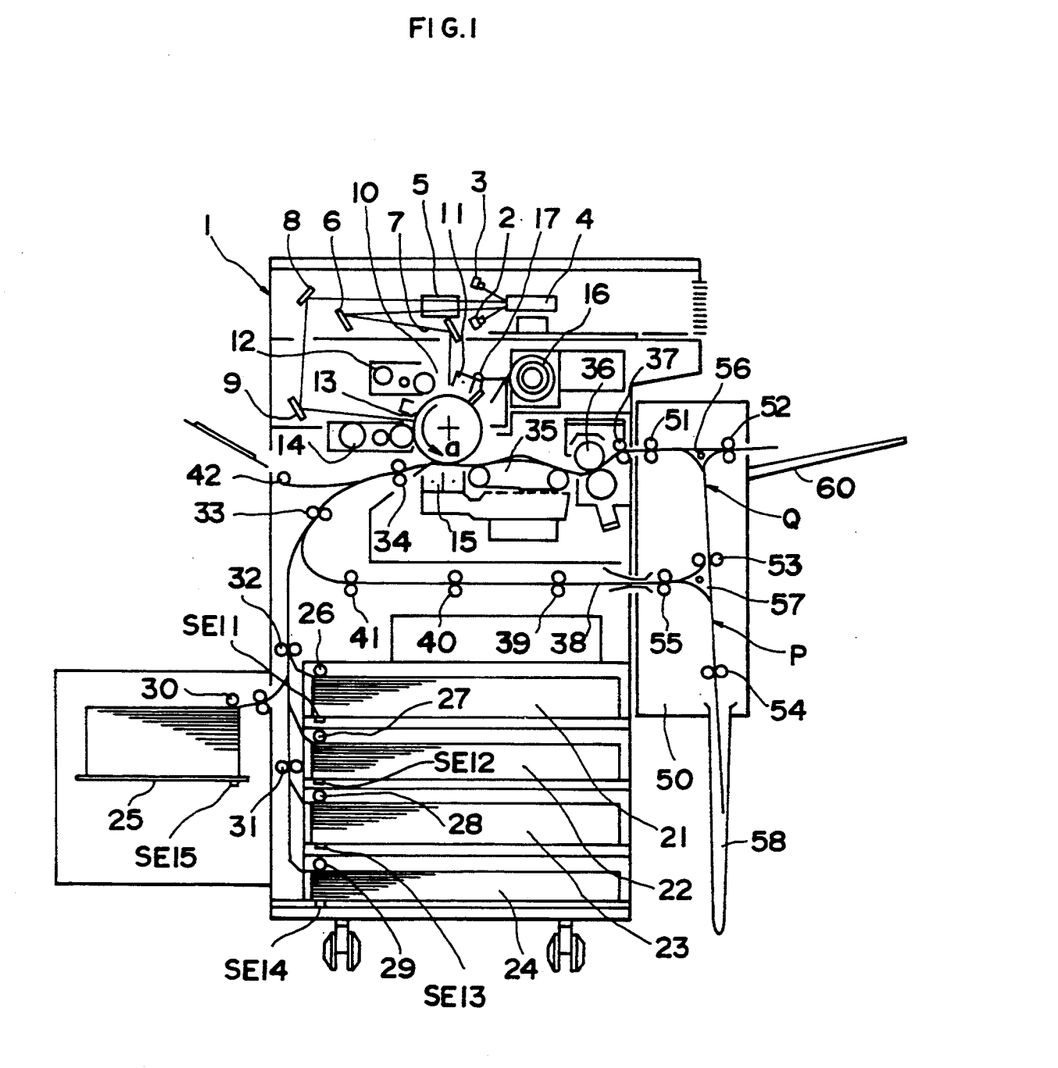
FIG. 1 is a section view showing the main unit of a laser printer provided with the counter of the present invention.

FIG. 1 shows a section view of the body 1 of a two-color laser printer provided with the counter of a first embodiment. The printer body is an integrated cabinet type having a front loading cassette, and in the center region thereof is provided photosensitive drum 10 which is rotatably driven in the arrow [a] direction. Arranged around the periphery of said photosensitive drum 10 is first charger 11, first developing device 12 of a magnetic brush type for adhering a first color toner, second charger 13, second developing device 14 of a magnetic brush type for adhering a second color toner, separation charger 15 for separating the transfer sheet, cleaning device 16 for removing residual toner, and eraser lamp 17 for removing residual charge. For example, image data transmitted from a host computer is modulated for intensity, and thereafter said modulated light is emitted from first laser element 2, and second laser element 3. After the laser light emitted from first laser element 2 scans via laser scanning unit 4, it is modulated by fθ lens 5, and the first exposure light is reflected by reflecting mirror 6, and irradiates the surface of photosensitive drum 10 directly after the surface is charged by first charger 11. A first electrostatic latent image is formed on the surface of photosensitive drum 10 via the aforesaid irradiation by first laser element 2. First developing device 12 adheres a first color toner on the aforesaid first electrostatic latent image, thereby forming a first toner image. @ After the laser light emitted from second laser element 3 scans via laser scanning unit 4, it is modulated by fθ lens 5, and the second exposure light is reflected by reflecting mirror 7, and irradiates the surface of photosensitive drum 10 directly after the surface is charged by second charger 13. A second electrostatic latent image is formed on the surface of photosensitive drum 10 via the aforesaid irradiation by second laser element 3. Second developing device 14 adheres a second color toner on the aforesaid second electrostatic latent image, thereby forming a second toner image.

Automatic paper feeding cassettes 21, 22, 23, 24 are provided at the bottom section of the printer body, and an optional automatic feed unit 25 of an elevator type is provided at the side of the cabinet. The size and amount of the paper sheets accommodated in each of the cassettes 21~24 and automatic feed unit 25 is detected by sensors SE11~SE15 provided within the respective cassettes. The paper sheets are selectively fed from cassettes 21, 22, 23, 24 and automatic feed unit 25 one sheet at a time via feed rollers 26~30, respectively. The paper sheets fed from cassettes 21, 22, and automatic feed unit 25 are transported by transport rollers 32 and 33 to timing roller 34, where they are temporarily stopped. The paper sheets fed from cassettes 23 and 24 are transported by transport rollers 31, 32 and 33 to timing roller 34, where they are temporarily stopped. The sheets fed via a manual mode are transported by transport roller 42 to timing roller 34, where they are temporarily stopped. The respective fed paper sheets are transported by the timing roller 34 to the transfer sheet separation charger 15 synchronously with the start position of the toner image formed on the surface of photosensitive drum 10. Transfer sheet separation charger 15 transfer the toner image formed on the surface of photosensitive drum 10 onto a paper sheet. The sheet carrying the transferred toner image is transported to fixing device 36 via transport belt 35. Fixing device 36 thermally fuses the toner image transferred onto the paper sheet, whereupon the sheet carrying the fixed toner image is delivered to sheet inverting unit 50 via discharge roller 37.

Sheet inverting unit 50 has a function for transporting a sheet to refeeding circuit 38 comprising rollers 39, 40, 41, and a function for selectively processing a face-up discharge (noninversion mode) wherein a sheet is transported directly to discharge tray 60, and a face-down discharge (inversion mode) wherein front and back sides of said sheet are reversed for duplex printing wherein a sheet already printed on one side is disposed for printing on the opposite side, and composite print wherein is superimposed on the same side of a previously printed sheet, and in order to accomplish the aforesaid functions is provided with transport roller 52, forward/reverse switching roller 53, and switchback path 58. Switch members 56 and 57 are switchable to two positions of rotational angle by means of a solenoid not shown in the illustrations.

In the non-inversion mode, a paper sheet is guided from a receiving roller by the top surface of switch member 56, and is output in a face-up state from an output roller to discharge tray 60. In the inversion mode, a paper sheet is guided from the receiving roller 51 by the left lateral surface of switch member 56, and the leading edge of said sheet is brought to the switchback path via the forward rotation of roller 54. When the trailing edge of the aforesaid sheet reaches inversion point Q, rollers 53 and 54 are switched to reverse rotation. The aforesaid sheet is then inverted such that the heretofore trailing edge becomes the leading edge, which is guided by the right lateral surface of switch member 56, and said sheet is output from output roller 52 to a paper tray in a face-down state.

In the duplex print mode, on the other hand, a paper sheet is transported to switchback path 58 in the same manner as described in the inversion mode, and when the trailing edge of said sheet reaches inversion point P, roller 54 is switched to reverse rotation. The sheet is then inverted such that the heretofore trailing edge becomes the leading edge, which is guided by the left lateral surface of switch member 57, and said sheet is transported from the refeeding roller to the refeeding path. In the composite print mode, a paper sheet is guided from roller 53 by the left top surface of switch member 57, so as to be transported from the refeeding roller to the refeeding path.

(2) Counter Device

The previously mentioned photosensitive drum 10, first charger 11, second developing device 14, and cleaning device 16 are provided as a single integrated unit (this unit is hereinafter referred to as "EP unit 100"). EP unit 100 is a consumable component, which is replaced each time a predetermined number of sheets are printed. The EP unit 100 is provided with an internal $E^2PROM$ 101 as a nonvolatile member for the purpose of knowing the aforesaid replacement period, and a control system described later has the function of controlling the count by said $E^2PROM$ 101. With the EP unit installed, $E^2PROM$ 101 is connected to the control system of the copying apparatus body.

Figure 2:
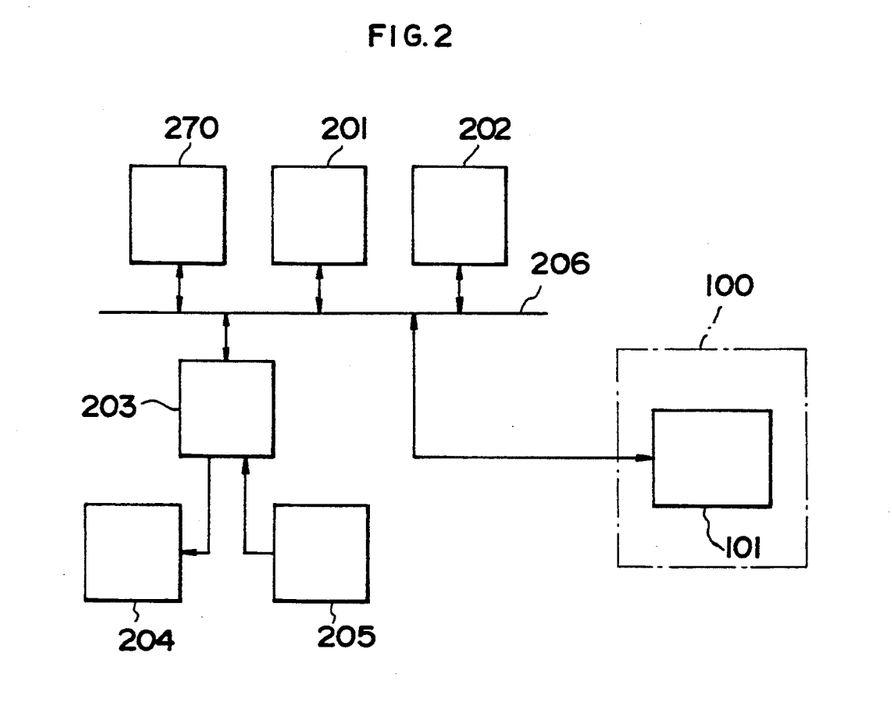
FIG. 2 is a block diagram showing the control block of the laser printer.
Figure 3:
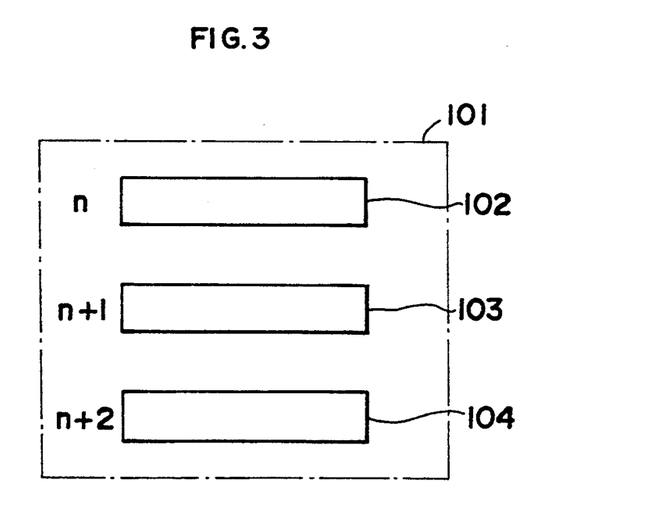
FIG. 3 is an illustration showing three subcounters 101, 102, 103 which comprise a counter provided with $E^2PROM$.

FIG. 2 is an illustration showing the control system for controlling the laser printer body 1. CPU 200 executes programs stored in ROM 201, and controls output device 204 and input device 205 via I/O LSI 203. CPU 200 accesses $E^2PROM$ 101 in EP unit 100 via CPU bus 206. As previously mentioned, $E^2PROM$ 101 has a counter for determining the replacement period of the EP unit. This counter comprises a plurality of subcounters. In the present embodiment, three subcounters 102, 103, 104 are provided, as shown in FIG. 3. Table 1 shows the values held by the three subcounters 102, 103, 104 relative to the number of printed sheets. As shown in the table, the values held by the three subcounters 102, 103, 104 are normally continuous (i.e., the sequence of the continuous count changes). The count value is the largest value among the values of each subcounter. For example, when the value of counter 102 is 3, the value of counter 103 is 4, and the value of counter 104 is 2, the count value is 4, and it is understood that four sheets have been printed. The count of the number of printed sheets is accomplished by rewriting the value of the subcounter storing the smallest value to a value which adds 1 to the largest value among the values of other subcounters, and using said resultant value as the count value, each time the number of printed sheets is increased by one sheet. As an example of the aforesaid calculation, when the number of printed sheets reaches 5, the value of counter 104 storing the smallest value 2 is rewritten to a value 5 which adds 1 to the value 4 of counter 103 storing the largest value, and said value 5 is designated the count value.

TABLE 1

| No. Printed sheets | Counter 102 | Counter 103 | Counter 104 |
| --- | --- | --- | --- |
| 0 | 0 | −1 | −1 |
| 1 | 0 | 1 | −1 |
| 2 | 0 | 1 | 2 |
| 3 | 3 | 1 | 2 |
| 4 | 3 | 4 | 2 |
| 5 | 3 | 4 | 5 |
| 6 | 6 | 4 | 5 |
| 7 | 6 | 7 | 5 |
| : | : | : | : |
| : | : | : | : |

In the case wherein an unexpected event, such as a sudden service interruption or the like, occurs when the values of each subcounter 102, 103, 104 are rewritten each time the counter increments so as to cause a rewrite error, the counter of the present embodiment corrects the value of the subcounter in which the rewrite error occurred in the sequence described below. Table 2 below illustrates a case wherein for some nonspecific reason the power supply is cut off after the printing of 11 sheets has been completed and during printing of the next sheet on the laser printer side, and the value of subcounter 102 which should be rewritten to 12 is erroneously rewritten to a value 99 by a conventional counter. This rewrite error currently only occurs in subcounters wherein the value is rewritten by CPU 200.

TABLE 2

| No. Printed Sheets | Counter 102 | Counter 103 | Counter 104 |
| --- | --- | --- | --- |
| : | : | : | : |
| : | : | : | : |
| 10 | 9 | 10 | 8 |
| 11 | 9 | 10 | 11 |
| 12 | 99 | 10 | 11 |
| : | : | : | : |
| : | : | : | : |

Figure 4:
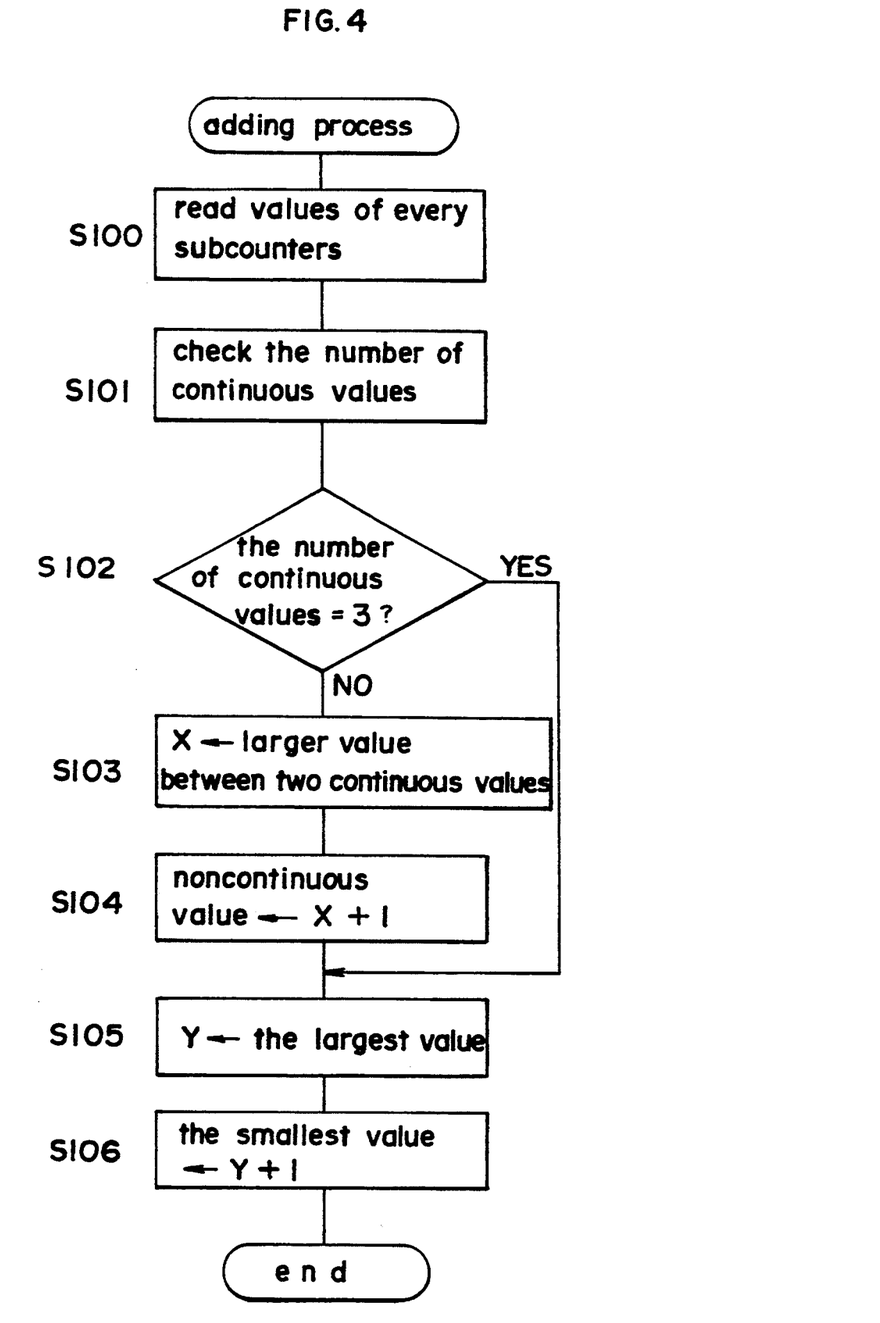
FIG. 4 is a flow chart showing the counter control process of a first embodiment.

FIG. 4 is a flow chart showing the counter control process of CPU 200. In this flow chart, the values of subcounters 102, 103, 104 are checked every time the counter value is incremented, such that when a rewrite error is detected, the value of the subcounter in which the rewrite error occurs can be corrected to the correct value. First, the value of each subcounter 102, 103, 104 is read (step S100). Then, the values held by all three individual subcounters are checked to determine whether or not they are mutually continuous (step S101). When the incrementation is accurately executed, the values of the three individual subcounters are continuous. When the values held by the three individual subcounters are continuous, a decision is made that the rewriting of the value held by the subcounter with the smallest value has been accurately executed (step S102: YES), whereupon the correction process of steps S103 and S104 is skipped. On the other hand, when only two of the individual subcounters hold continuous values, it is decided that for some unspecified reason a rewrite error occurred during the immediately previous count incrementation (step S102: NO), whereupon the correction process of steps S103 and S104 is executed. Therefore, since the rewriting of the subcounters is executed once for individual subcounter units, the case wherein the values of all three subcounters are noncontinuous need not be considered. The correction process of step S103 stores in a buffer X the largest value among the values of the two subcounters having continuous values among the three individual subcounters. Then, in step S104, the value of the single remaining subcounter having the noncontinuous value is rewritten to a value which adds 1 to the aforesaid value stored in buffer X. The values of all three individual subcounters then become continuous by means of the correction process of steps S103 and S104. Then, in steps S105 and S106, a substantial counter control process is executed. First, in step S105, the value of the subcounter holding the largest value among the three subcounters is stored in buffer area Y. Then, in step S106, the value of the subcounter holding the smallest value is rewritten to a value which adds 1 to the aforesaid value stored in buffer Y, and the resultant value is designated the count value.

The number of printed sheets can be accurately counted by executing the previously described process. Thus, effectively eliminating adverse effects on the laser printer resulting from instructions to replace the EP unit too early, or conversely, use the EP unit too long due to a count error by the counter.

Figure 5:
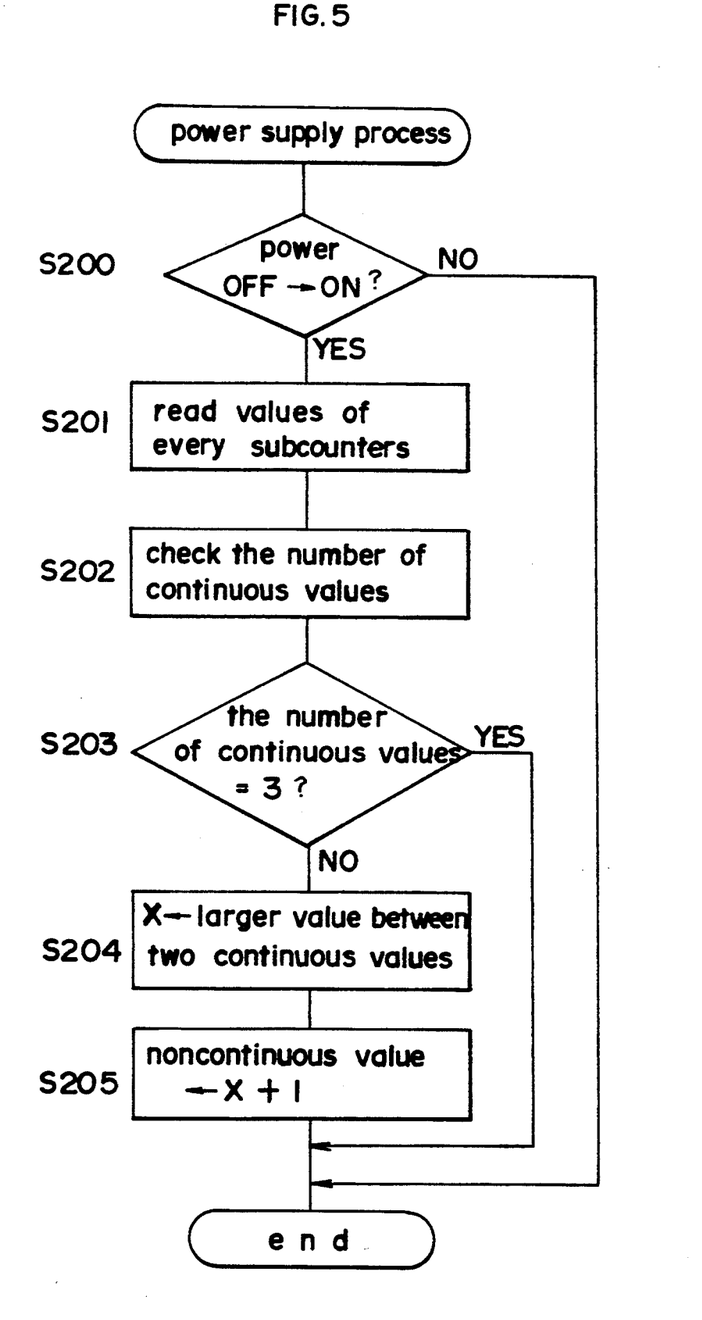
FIG. 5 is a flow chart showing the counter control process of a first embodiment executed whenever the power source is cut off and subsequently restarted.

FIG. 5 is a flow chart showing counter control process executed whenever the power supply to the laser printer is cut off once and restarted again. When the power source is cut off (step S200: YES), the following process is executed. First, the value of each subcounter 102, 103, 104 is read (step S201). Then, a check is made to determine whether or not the values held by all three subcounters are mutually continuous (step S202). When the incrementation has been accurately executed, the values of the three individual subcounters are continuous. When the values held by the three individual subcounters are mutually continuous, it is decided that the rewriting of the value of the subcounter having the smallest value has been accurately executed (step S203: YES). Then, the correction process of steps S204 and S205 is skipped, and the process is completed. On the other hand, when only two of the individual subcounters hold continuous values, it is decided that for some unspecified reason a rewrite error occurred during the immediately previous count incrementation (step S203: NO), whereupon the correction process of steps S204 and S205 is executed. Therefore, since the rewriting of the subcounters is executed once for individual subcounter units, the case wherein the values of all three subcounters are noncontinuous need not be considered. The correction process of step S204 stores in a buffer X the largest value among the values of the two subcounters having continuous values among the three individual subcounters. Then, in step S205, the value of the single remaining subcounter having the noncontinuous value is rewritten to a value which adds 1 to the aforesaid value stored in buffer X. The values of all three individual subcounters then become continuous by means of the correction process of steps S204 and S205.

When the power supply of the apparatus is suddenly cut off due to an unforeseen event such as a service interruption or the like, the count error generated by said event is detected, and corrected to the correct value by means of the previously described process.

Figure 6:
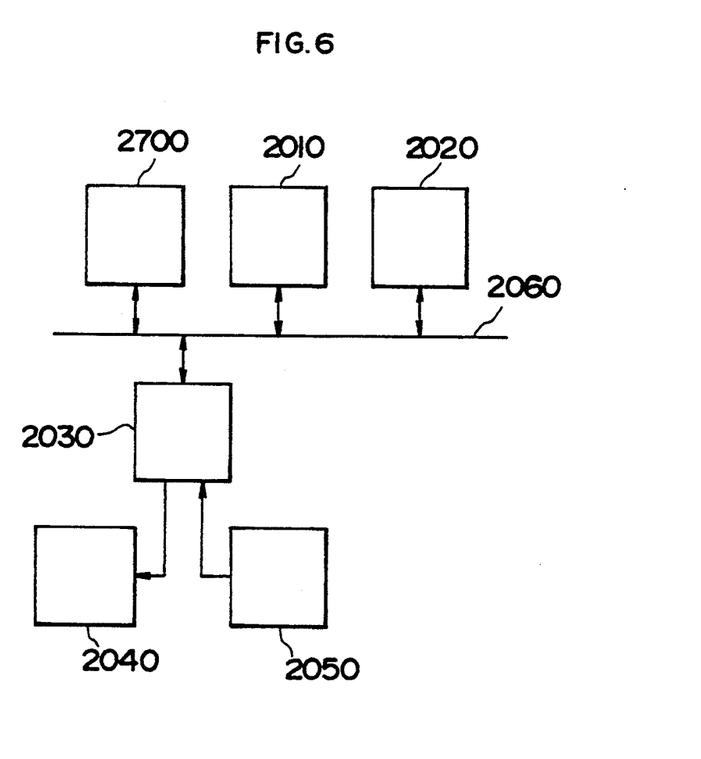
FIG. 6 is a block diagram showing the control block of the laser printer.
Figure 7:
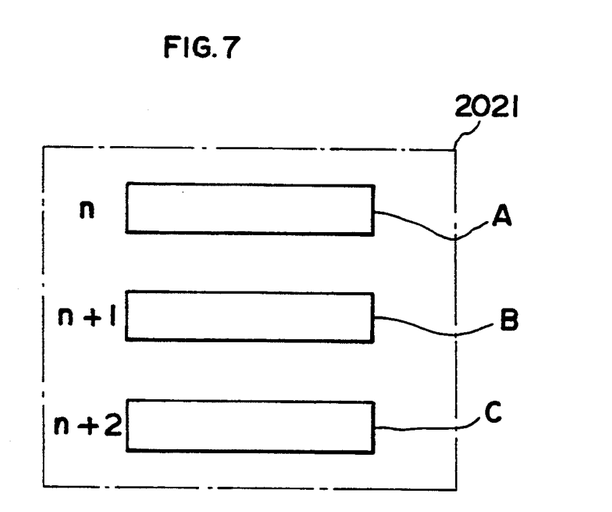
FIG. 7 is an illustration three areas A, B, C comprising counter 2021 provided in RAM 2020 of a second embodiment.

A second embodiment of the counter of the present invention is described hereinafter with reference to FIGS. 6 and 7. The second embodiment is a counter of a decrementing type which indicates the number of sheets remaining to be printed during continuous multi-printing of the same image. The counter of the second embodiment is provided within the laser printer. Specifically, RAM 2020 is provided with the counter of the second embodiment in the control system for controlling the laser printer, as shown in FIG. 6. Three areas A, B, C are defined in the counter 2021 provided in RAM 2020, as shown in FIG. 7. Table 3 shows the values held in the three areas A, B, C relative to the number of sheet remaining to be printed.

TABLE 3

| No. Print Sheets | Area A | Area B | Area B |
| --- | --- | --- | --- |
| 0 | 10 | 11 | 12 |
| 1 | 10 | 11 | 9 |
| 2 | 10 | 8 | 9 |
| 3 | 7 | 8 | 9 |
| 4 | 7 | 8 | 6 |
| 5 | 7 | 5 | 6 |
| 6 | 4 | 5 | 6 |
| 7 | 4 | 5 | 99 |
| : | : | : | : |
| : | : | : | : |
| : | : | : | : | as shown in Table 3, the values held in the three areas A, B, C are normally continuous. (The sequence of the continuous areas is variable, however.) The smallest value among the various areas is designated the count value. For example, in the case of continuously printing 10 sheets, when the value of area A is 7, the value of area B is 8, and the value of area C is 9, it is understood that there are seven sheets remaining to be printed.

The decrementation operation of counter 2021 is described hereinafter. When a user specifies continuous printing of a desired number of sheets from input device 2050 such as a ten-key pad or the like and the number 10 is input, CPU 2000 stores the value 10 in area A. CPU 2000 adds 1 to the value stored in area A and stores the resultant value 11 in area B, and adds 1 to the value stored in area B and stores the resultant value 12 in area C. Thus, CPU 2000 initializes the value stores in each area in counter 2021 before printing is started, and thereafter, every time the number of printed sheets increases by 1, the value of the area in which the largest value is stored is rewritten to a value obtained by subtracting 1 from the smallest value among the values stored in the other areas, and the resultant value is designated the count value by which the count of the remaining sheets to be printed is executed. In the case of the above example, when the number of printed sheets reaches four sheets (i.e., when six sheets remain to be printed), the value of area C which holds a maximum value of 9 is rewritten to a value 6 by subtracting 1 from the value 7 of area A which holds the smallest value, and the resultant value 6 is designated the count value.

A rewrite error is generated when electrical noise is produced within the circuits due to a paper jam or the like whenever some value of the areas A, B, C is being rewritten as occurs each time the counter 2021 decrements as previously described. As shown previously in Table 3, in the case wherein ten sheets are being continuously printed and seven of said sheets have been completed and a jam occurs during the printing of a next sheet, the electrical noise generated by said jam causes a the value of area C, which should be rewritten "3," to be erroneously rewritten "99." This rewrite error occurs only in the area currently being rewritten by CPU 2000.

Figure 8:
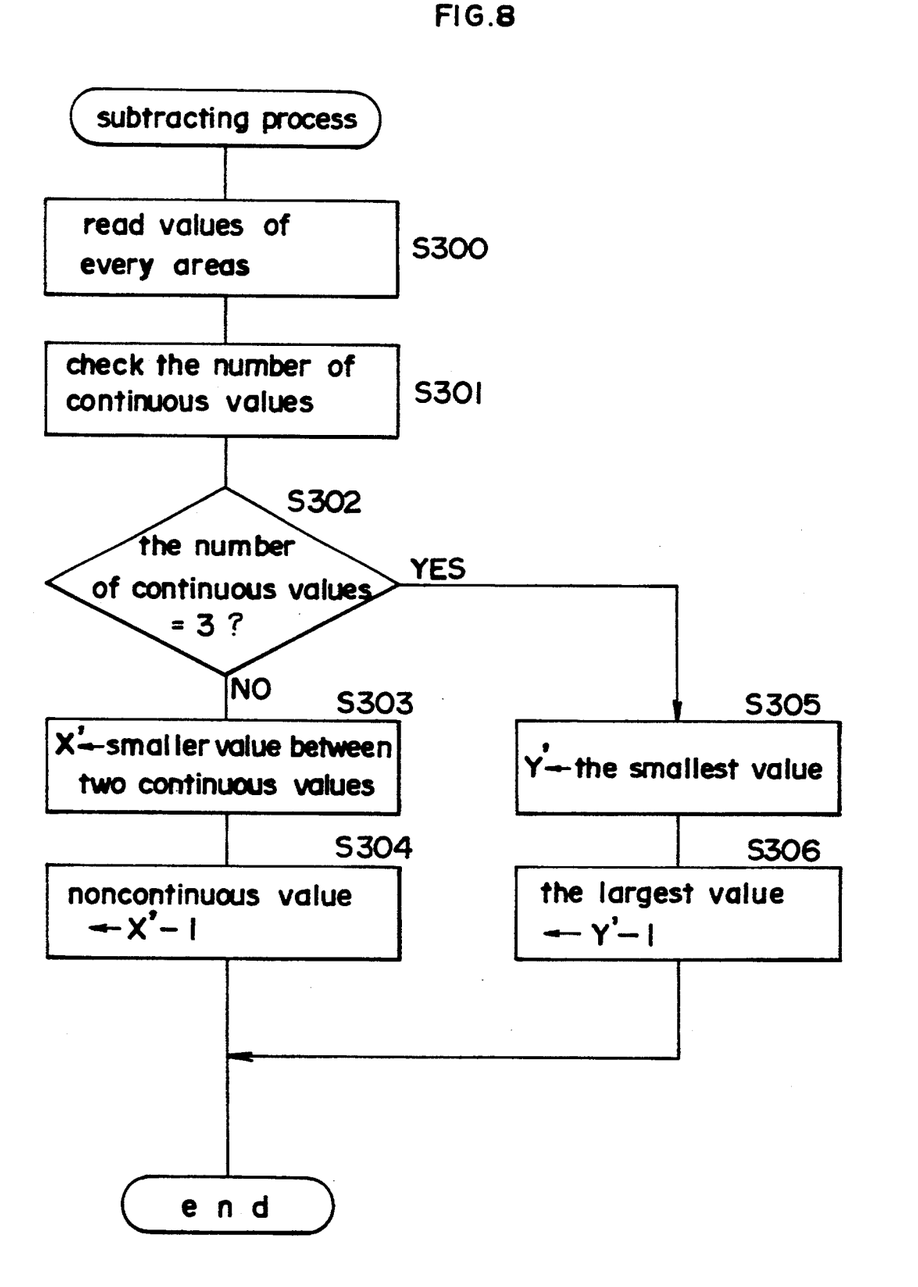
FIG. 8 is a flow chart showing the count control process of the second embodiment.

The counter of the present embodiment corrects the value of the area in which the rewrite error occurs even when the previously described rewrite error is generated. The sequence of this correction is shown in FIG. 8.

CPU 2000 checks the value of areas A, B, C each time counter 2021 decrements, and when a rewrite error is detected, the value of the area in which said rewrite error occurs is corrected to the correct value. First, in step S300, CPU 2000 checks the values of each area, and determines, in step S302, whether or not all values of the three areas are continuous. If the reply to the query is YES in step S302, i.e., if the values of the three areas are continuous, the decrementation is determined to have been correctly executed. Then, in step S305, the value of the area having the smallest value is stored in buffer Y', and in step S306, the value of the area holding the largest value is rewritten to a value obtained by subtracting 1 from the value stored in buffer Y'. On the other hand, when only two of the areas hold continuous values, i.e., the reply to the query of step S302 is NO, it is determined that a rewrite error has occurred for some unspecified reason during the previous decrementation, and the correction process is executed. As previously described, since the rewriting of the areas is executed once for individual area, the case wherein the values of all three areas are noncontinuous need not be considered. The correction process stores in buffer X' the smallest value among the values of the two areas having continuous values among said three areas in step S303. Then, in step S304, the value of the area with the noncontinuous value is rewritten to a value obtained by subtracting 1 from the value stored in the aforesaid buffer X', so as to return the value of each area to their original state prior to the generation of the rewrite error. After the aforesaid correction process is completed, counter 2021 awaits restart after jam processing or the like, and then restarts decrementation.

Count errors are detected and corrected to correct values by means of the previously described process even when count errors are generated due to electrical noise occurring in the circuits including the counter due to paper jams and the like.

Although the first and second embodiments of the present invention use incrementation process or decrementation process after verifying the absence of a count error or correcting the count value following the occurrence of a count error during counting, it is to be noted that the count error may be detected and corrected after the execution of said incrementation process or decrementation process.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A counter comprising:
   a memory which stores continuous numerical values;
   rewriting means for rewriting a lowest numerical value to a numerical value obtained by adding 1 to a largest numerical value within said continuous numerical values stored in the memory;
   discrimination means for discriminating whether or not the numerical values stored in the memory are continuous; and
   decision means for deciding a count error has been generated when said discrimination means discriminates that said numerical values stored in memory are not continuous.

2. A counter according to claim 1, wherein said memory holds; the stored numerical values during shut off the power.

3. A counter comprising:
   a memory which stores at least three continuous numerical values;
   rewriting means for rewriting a lowest numerical value to a numerical value obtained by adding 1 to a largest numerical value within said continuous numerical values stored in the memory;
   discrimination means for discriminating whether or not said three numerical values stored in the memory are continuous;
   decision means for deciding a count error has been generated when said discrimination means discriminates that said numerical values stored in the memory are not continuous; and
   correcting means for correcting the noncontinuous numerical value by adding 1 to the largest value of other continuous numerical values stored in said memory when said decision means decides that said numerical values stored in the memory are not continuous.

4. A counter according to claim 3, wherein said discrimination means, decision means and correcting means actuate when power is supplied.

5. A counter comprising:
   a memory which stores continuous numerical values;
   rewriting means for rewriting a largest numerical value to a numerical value obtained by subtracting 1 from a lowest numerical value within said continuous numerical values stored in the memory;
   discrimination means for discriminating whether or not the numerical values stored in memory are continuous; and
   decision means for deciding a count error has been generated when said discrimination means discriminates that said numerical values stored in the memory are not continuous.

6. A counter comprising:
   a memory which stores continuous numerical values;
   rewriting means for rewriting a largest numerical value to a numerical value obtained by subtracting 1 from a lowest numerical value within said continuous numerical values stored in the memory;
   discrimination means for discriminating whether or not the numerical values stored in memory are continuous;
   decision means for deciding a count error has been generated when said discrimination means discriminates that said numerical values stored in the memory are not continuous; and
   correcting means for correcting the noncontinuous numerical value by subtracting 1 from the lowest value of other continuous numerical values stored in said memory, when said decision means decides that said numerical values stored in the memory are not continuous.

7. A counter according to claim 5, further comprising input means which inputs initial data for said memory.

8. A counter according to claim 5, wherein said counter is provided in an image forming apparatus, and counts the number of paper on which an image has been formed.

9. A counter used for counting a number of sheets on which an image is formed by an image forming apparatus, said counter comprising:
   a memory in which continuous numerical values are stored;
   rewriting means, in response to a signal generated from said image forming apparatus, for rewriting the lowest numerical value stored in said memory to a numerical value obtained by adding 1 to a largest numerical value stored in said memory;
   discrimination means for discriminating whether or not the numerical value rewritten by said rewriting means is continuous with other numerical value stored in said memory; and
   decision means for deciding a count error when said discrimination means discriminates that said numerical value rewritten by said rewriting means is not continuous with other numerical value stored in said memory.

10. A counter according to claim 9, wherein said memory stores at least three numerical values and said counter further comprising correcting means for correcting the numerical value rewritten by said rewriting means to a numerical value obtained by adding 1 to the largest value of other continuous numerical values stored in said memory if said decision means decides that the numerical value rewritten by said rewriting means is not continuous with other numerical values stored in said memory.

11. A counter according to claim 10, wherein said memory is mounted on an imaging cartridge which is detachably provided in said image forming apparatus.

* * * * *